US010070570B2

(12) United States Patent
Amano et al.

(10) Patent No.: US 10,070,570 B2
(45) Date of Patent: Sep. 4, 2018

(54) MOUNTING DEVICE, IMAGE PROCESSING METHOD, AND IMAGING UNIT

(71) Applicant: FUJI CORPORATION, Chiryu-shi (JP)

(72) Inventors: Masafumi Amano, Okazaki (JP); Kazuya Kotani, Toyota (JP); Yusuke Yamakage, Anjo (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/556,821

(22) PCT Filed: Mar. 10, 2015

(86) PCT No.: PCT/JP2015/056956
§ 371 (c)(1),
(2) Date: Sep. 8, 2017

(87) PCT Pub. No.: WO2016/143058
PCT Pub. Date: Sep. 15, 2016

(65) Prior Publication Data
US 2018/0054932 A1 Feb. 22, 2018

(51) Int. Cl.
*H04N 5/253* (2006.01)
*H05K 13/08* (2006.01)
(Continued)

(52) U.S. Cl.
CPC .............. *H05K 13/08* (2013.01); *G06T 7/60* (2013.01); *G06T 7/70* (2017.01); *H04N 5/23216* (2013.01);
(Continued)

(58) Field of Classification Search
CPC .............. H05K 13/08; H05K 13/0404; H05K 13/0408; H05K 13/0413; G06T 7/70; G06T 7/74
(Continued)

(56) References Cited

U.S. PATENT DOCUMENTS 7,034,272 B1 4/2006 Leonard et al.
8,224,063 B2 * 7/2012 Kameda .................... G06T 7/73
356/399
(Continued)

FOREIGN PATENT DOCUMENTS

EP 2 587 450 A1 5/2013
JP 2005-11950 A 1/2005
(Continued)

OTHER PUBLICATIONS

Extended European Search Report dated Dec. 12, 2017 in Patent Application No. 15884550.3.
(Continued)

Primary Examiner — Ngoc-Yen Vu
(74) Attorney, Agent, or Firm — Oblon, McClelland, Maier & Neustadt, L.L.P.

(57) ABSTRACT

A mounting device that, during movement of a mounting head, captures a first image that includes components that are collected in the mounting head and first fiducial marks, captures a second image that includes the components that are collected in the mounting head and second fiducial marks, and generates an image of the components that are collected in the mounting head using the first image and the second image based on the positional relationship of the first fiducial marks and the second fiducial marks. At this time, the mounting device captures the first image after the components and the first fiducial marks enter the same imaging range prior to the second fiducial marks entering the imaging range, and after that, captures the second image after the first fiducial marks come out from the imaging
(Continued)

range and the components and the second fiducial marks enter the same imaging range.

8 Claims, 8 Drawing Sheets

(51) Int. Cl.
    *H04N 5/232*     (2006.01)
    *G06T 7/70*     (2017.01)
    *H05K 13/04*     (2006.01)
    *G06T 7/60*     (2017.01)
    *H04N 9/04*     (2006.01)
    *G06T 7/73*     (2017.01)

(52) U.S. Cl.
    CPC ............ *H05K 13/0413* (2013.01); *G06T 7/74* (2017.01); *G06T 2207/30204* (2013.01); *H05K 13/0452* (2013.01)

(58) Field of Classification Search
    USPC ................................. 348/86, 87, 207.99, 373
    See application file for complete search history.

(56) References Cited

U.S. PATENT DOCUMENTS

| | | | | |
|---|---|---|---|---|
| 8,973,255 | B2* | 3/2015 | Amano | ............. H05K 13/0413 29/739 |
| 9,438,777 | B2* | 9/2016 | Yamakage | ............. H05K 13/08 |
| 2002/0136443 | A1 | 9/2002 | Chi et al. | |
| 2009/0252400 | A1* | 10/2009 | Iwase | ..................... H05K 13/08 382/141 |
| 2011/0098840 | A1* | 4/2011 | Inaba | ................. H05K 13/0452 700/114 |
| 2013/0108017 | A1 | 5/2013 | Golubovic et al. | |
| 2013/0304249 | A1* | 11/2013 | Suzuki | ................. G05B 13/021 700/193 |
| 2015/0369757 | A1 | 12/2015 | Golubovic et al. | |
| 2016/0150689 | A1* | 5/2016 | Amano | ................ H04N 5/2253 29/739 |

FOREIGN PATENT DOCUMENTS

| | | |
|---|---|---|
| JP | 2008-211009 A | 9/2008 |
| JP | 2012-3469 A | 1/2012 |
| JP | 2012-64781 A | 3/2012 |
| JP | 2013-21196 A | 1/2013 |
| WO | WO 2014/068766 A1 | 5/2014 |
| WO | WO 2015/004717 A1 | 1/2015 |

OTHER PUBLICATIONS

International Search Report dated Jun. 2, 2015 in PCT/JP2015/056956 filed Mar. 10, 2015.

* cited by examiner

MOUNTING DEVICE, IMAGE PROCESSING METHOD, AND IMAGING UNIT

TECHNICAL FIELD

The present application relates to a mounting device, an imaging processing method, and an imaging unit.

BACKGROUND ART

A method in which multiple images that include positional deviation are acquired, positioning of the plurality of images is carried out, and an interpolated image is generated by interpolation processing based on the plurality of images is suggested as an imaging processing method in the related art (for example, refer to PTL 1). In the method, an image is selected that is used in generation of a composite image by an optimization process in which positioning precision is weighted.

CITATION LIST

Patent Literature

PTL 1: JP-A-2012-003469

SUMMARY

Technical Problem

Note that, a mounting device that is provided with a mounting head that collects components, and that mounts the components on a board using a mounting head is given as an example of a device that adopts such an imaging processing method. In such a mounting device, there is a case where an image that includes a collected component is captured while moving the mounting head having collected the component. In addition, at this time, generating a composite image of a component using multiple images in the mounting device is considered. However, further widening an imaging range in the imaging processing method described above is not considered. Therefore, in the imaging processing method described above, productivity is lowered, for example, in a case where an imaging target is large, the composite image is generated by repeating the process of imaging by temporarily stopping the mounting head and the like.

The disclosure is made in consideration of such problems, and the main object is to provide a mounting device, an imaging processing method, and an imaging unit that are able to obtain a higher quality image while further suppressing lowering of productivity.

Solution to Problem

The disclosure adopts the following means to achieve the main object described above.

According to the disclosure, there is provided a mounting device including a mounting head that has first fiducial marks, second fiducial marks that have a predetermined positional relationship with the first fiducial marks, and a collection member that collects components, and moves the collected components on the board, an imaging section that captures an image, and a control section that, during movement of the mounting head, causes the imaging section to capture a first image that includes the components that are collected in the mounting head and the first fiducial marks, causes the imaging section to capture a second image that includes the components that are collected in the mounting head and the second fiducial marks, and generates an image of the components that are collected in the mounting head using the first image and the second image based on the positional relationship of the first fiducial marks and the second fiducial marks.

The mounting device, during movement of the mounting head, images the first image that includes the components that are collected in the mounting head and the first fiducial marks, images the second image that includes the components that are collected in the mounting head and the second fiducial marks, and generates the image of the components that are collected in the mounting head using the first image and the second image based on the positional relationship of the first fiducial marks and the second fiducial marks. The mounting device is able to carry out positioning of the first image and the second image utilizing the positional relationship of the first fiducial marks and the second fiducial marks, and obtain a high quality image that includes the components. In addition, in the mounting device, it is possible to further widen an imaging range up to a range that includes any fiducial mark and it is possible to suppress stopping of movement of the mounting head while imaging the mounting head. Accordingly, the mounting device is able to obtain a higher quality image while further suppressing lowering of productivity.

In the mounting device of the disclosure, in the mounting head, the first fiducial marks and the second fiducial marks may be arranged on the outer peripheral side of the collection member. In the mounting device, it is possible to set the positions of the first fiducial marks and the second fiducial marks further separated from each other and it is possible to further widen the imaging range.

In the mounting device of the disclosure, in the mounting head, the first fiducial marks and the second fiducial marks may be arranged on the front side and the rear side in the movement direction of the mounting head. The mounting device tends to obtain a higher quality image while further suppressing lowering of productivity since either of the first fiducial marks and the second fiducial marks tend to enter the imaging range even if the mounting head moves.

In the mounting device of the disclosure, the control section may determine one or more out of the shapes of the components and the positions of the components based on the generated image of the components. The mounting device is used to carry out determination of whether the shapes and positions of the components are appropriate and is able to obtain a higher quality image.

In the mounting device of the disclosure, the mounting head may have two or more collection members, the control section may cause the imaging section to capture the first image and the second image at a timing at which the components that are collected in the two or more collection members are in the same imaging range. In the mounting device, imaging efficiency is good since multiple components are imaged in the same image.

In the mounting device of the disclosure, the control section may cause the imaging section to capture the first image after the components and the first fiducial marks enter the same imaging range prior to the second fiducial marks entering the imaging range, and after that, may cause the imaging section to capture the second image after the first fiducial marks come out from the imaging range and the collected components and the second fiducial marks enter the same imaging range.

According to the disclosure, there is provided an imaging processing method, for a mounting device that includes a mounting head that has first fiducial marks, second fiducial marks that have a predetermined positional relationship with the first fiducial marks, and a collection member that collects the components, and moves the collected components on the board, and an imaging section that captures an image, the method including: (a) a step of, during movement of the mounting head, causing the imaging section to capture a first image that includes the components that are collected in the mounting head and the first fiducial marks, and causing the imaging section to capture a second image that includes the components that are collected in the mounting head and the second fiducial marks, and (b) a step of generating an image of the components that are collected in the mounting head using the first image and the second image based on the positional relationship of the first fiducial marks and the second fiducial marks.

In the same manner as the mounting device described above, in the imaging processing method, it is possible to carry out positioning of the first image and the second image utilizing the positional relationship of the first fiducial marks and the second fiducial marks, and obtain a high quality image that includes the components. In addition, in the mounting device, it is possible to further widen an imaging range up to a range that includes any fiducial mark and it is possible to suppress stopping of movement of the mounting head while imaging the mounting head. Accordingly, in the imaging processing method, it is possible to obtain a higher quality image while further suppressing lowering of productivity. Note that, in the imaging processing method, various aspects of the mounting device described above may be adopted, or a step may be added such that each function of the mounting device described above is realized.

According to the disclosure, there is provided an imaging unit that is used in a mounting device that includes a mounting head that has first fiducial marks, second fiducial marks that have a predetermined positional relationship with the first fiducial marks, and a collection member that collects the components, and moves the collected components on the board, the unit including: an imaging section that captures an image; and a control section that, during movement of the mounting head, causes the imaging section to capture a first image that includes the components that are collected in the mounting head and the first fiducial marks, causes the imaging section to capture a second image that includes the components that are collected in the mounting head and the second fiducial marks, and generates an image of the components that are collected in the mounting head using the first image and the second image based on the positional relationship of the first fiducial marks and the second fiducial marks.

In the same manner as the mounting device described above, the imaging unit is able to obtain a higher quality image while further suppressing lowering of productivity. Note that, in the imaging unit, various aspects of the mounting device described above may be adopted, or a step may be added such that each function of the mounting device described above is realized.

DESCRIPTION OF EMBODIMENTS

Figure 1:
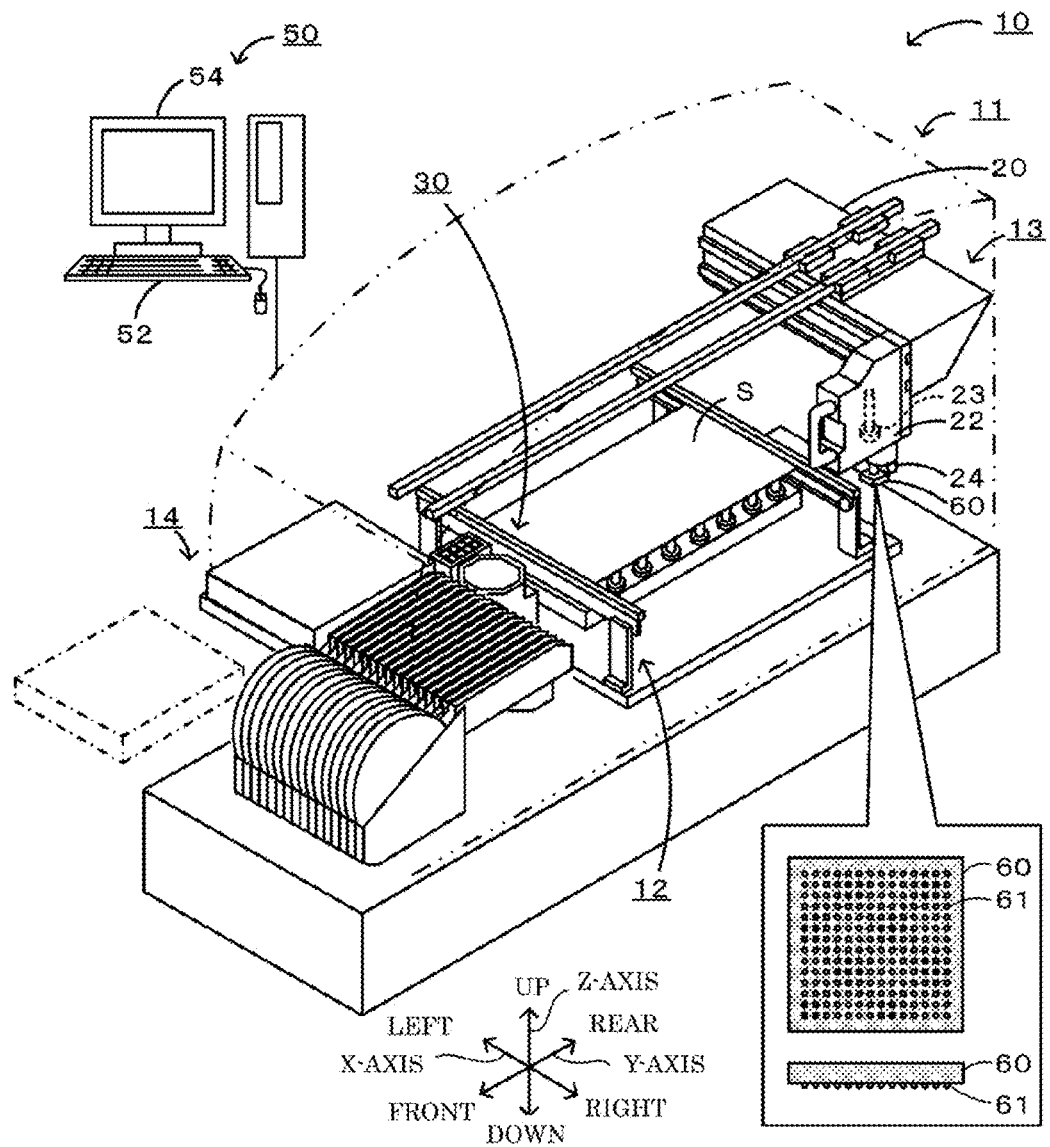
FIG. 1 is a schematic explanatory diagram illustrating an example of a mounting system 10.
Figure 2:
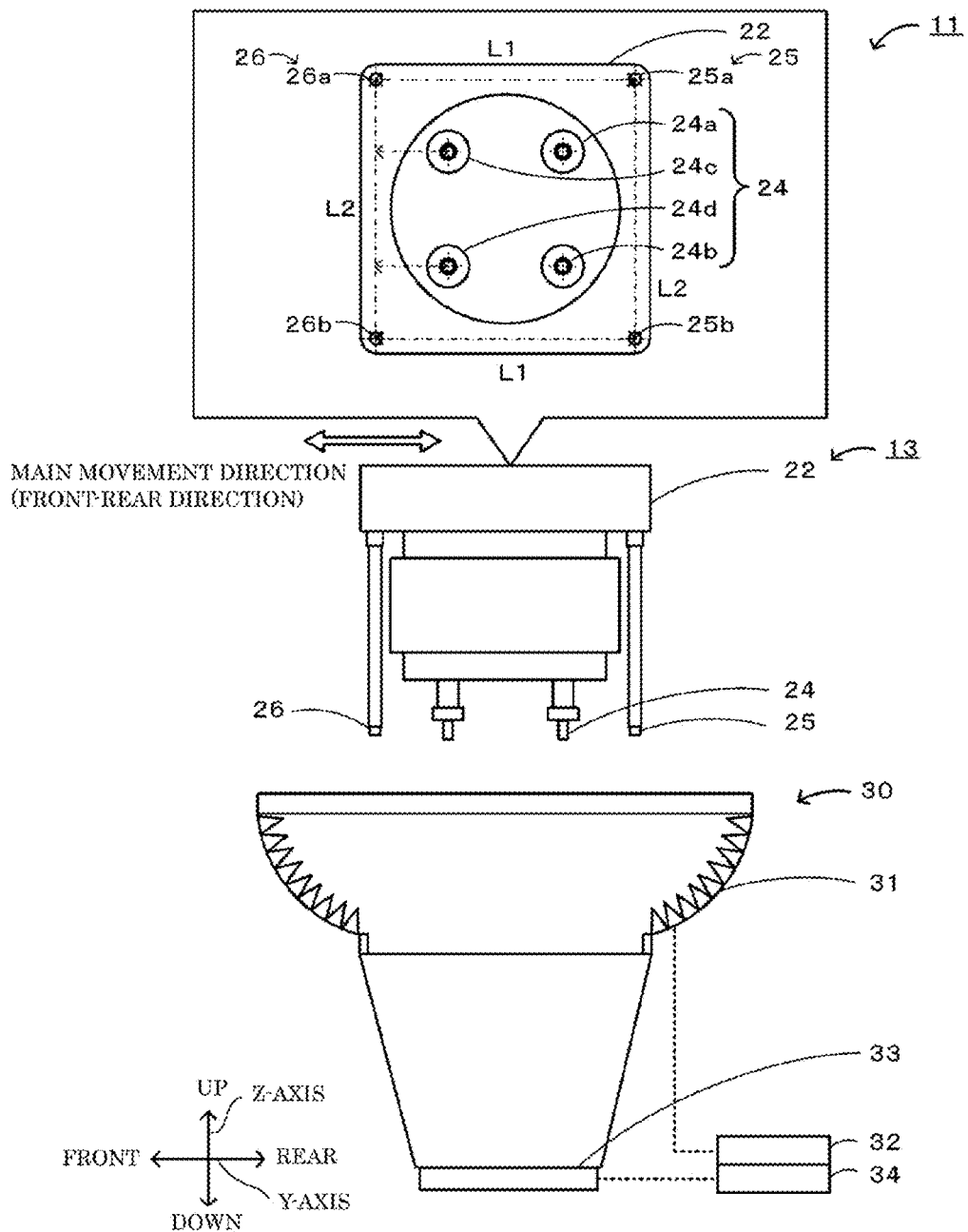
FIG. 2 is an explanatory diagram of a mounting head 22 and an imaging unit 30.
Figure 3:
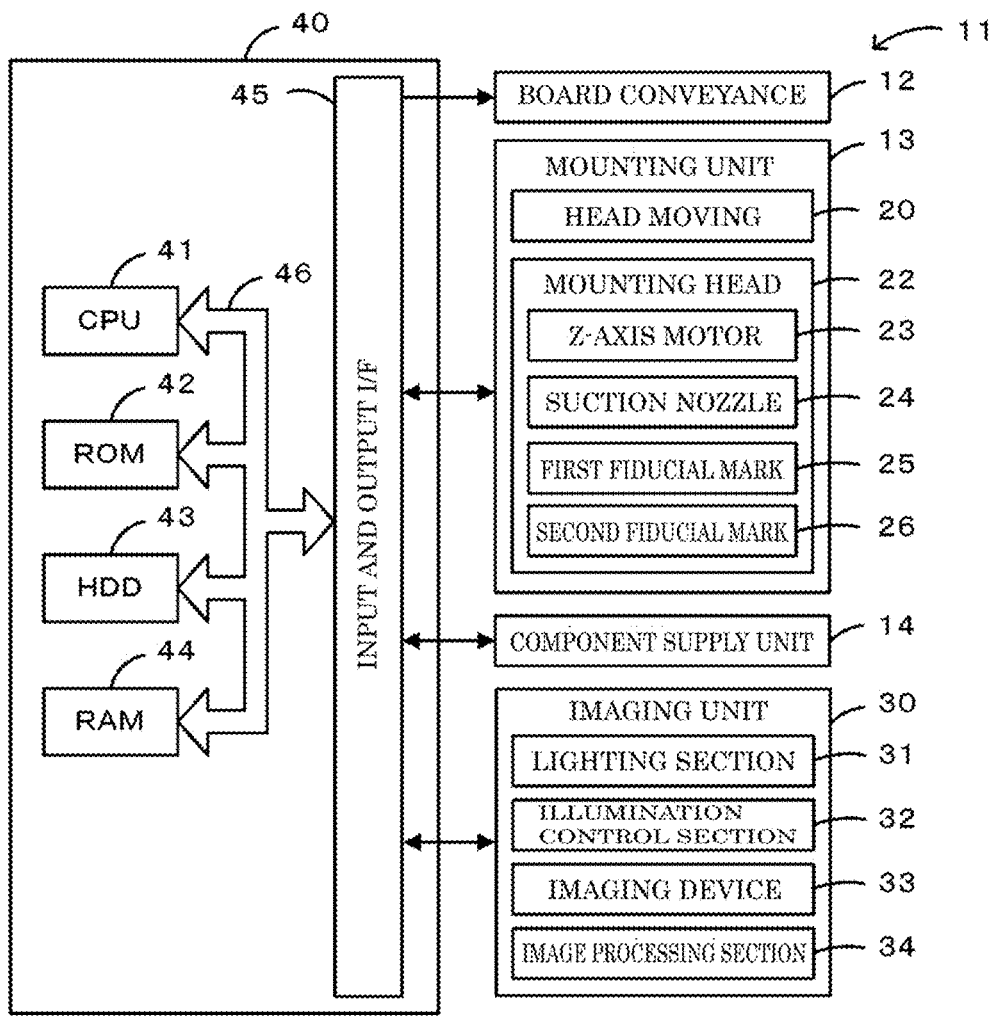
FIG. 3 is a block diagram illustrating a configuration of a mounting device 11.

Appropriate embodiments of the disclosure are described below with reference to the drawings. FIG. 1 is a schematic explanatory diagram illustrating an example of a mounting system 10. FIG. 2 is an explanatory diagram of a mounting head 22 and an imaging unit 30. FIG. 3 is a block diagram illustrating a configuration of a mounting device 11. For example, the mounting system 10 is a system that performs a mounting process which relates to a process for mounting components 60 on a board S. The mounting system 10 is provided with the mounting device 11 and a management computer 50. In the mounting system 10, multiple mounting devices 11 that carry out the mounting process for mounting the components on the board S are arranged from the upstream to the downstream. FIG. 1 indicates only one mounting device 11 for convenience of description. Note that, the mounting process includes processes for arrangement, mounting, inserting, joining, adhering, and the like of the components on the board. In addition, in the present embodiment, a left-right direction (X-axis), a front-rear direction (Y-axis), and an up-down direction (Z-axis) are as indicated in FIGS. 1 and 2.

As illustrated in FIGS. 1 and 3, the mounting device 11 is provided with a board conveyance unit 12, a mounting unit 13, a component supply unit 14, an imaging unit 30, and a control device 40. The board conveyance unit 12 is a unit that carries out taking in and conveyance of the board S and fixing and taking out at the mounting position. The board conveyance unit 12 has a pair of conveyor belts that are provided with a clearance to the front-rear in FIG. 1 and bridge in the left-right direction. The board S is conveyed by the conveyor belts.

The mounting unit 13 collects the components 60 from the component supply unit 14, and arranges the components 60 on the board S that is fixed to the board conveyance unit 12. As illustrated in FIG. 1, for example, the components 60 are BGA components provided with multiple bumps 61 arranged in a lower portion of a main body with a relatively large plate shape. The mounting unit 13 is provided with a head moving section 20, the mounting head 22, and a suction nozzle 24. The head moving section 20 is provided with a slider that is guided on a guide rail and moves in the XY-directions and a motor that drives the slider. The mounting head 22 is mounted to be removable on the slider, and moves in the XY-directions by the head moving section 20. One or more suction nozzles 24 are mounted to be removable on a lower face of the mounting head 22. In this arrangement, a case is mainly described in which four nozzles of suction nozzles 24a-24d are mounted by the mounting head 22 (FIG. 2). In addition, in this arrangement, the suction nozzles 24a-24d are collectively referred to as suction nozzles 24. The suction nozzles 24 collect the components 60 utilizing negative pressure, and are mounted on the mounting head 22 to be removable. The mounting head 22 has a built-in Z-axis motor 23, and adjusts the height of the suction nozzles 24 along the Z-axis using the Z-axis motor. In addition, the mounting head 22 is provided with a rotation device that rotates (spins) the suction nozzles 24 using a driving motor which is not shown in the drawings, and is able to adjust the angle of the components that are collected (sucked) to the suction nozzles 24.

As illustrated in FIG. 2, first fiducial marks 25a and 25b and second fiducial marks 26a and 26b that are reference positions of the collected components are arranged on the lower face side of the mounting head 22 to be removable and replaceable. Note that, in this arrangement, the first fiducial marks 25a and 25b are collectively referred to as first fiducial marks 25, and the second fiducial marks 26a and 26b are collectively referred to as second fiducial marks 26. In the mounting head 22, the first fiducial marks 25 and the second fiducial marks 26 are arranged on the outer peripheral side of the suction nozzles 24. The first fiducial marks 25 and the second fiducial marks 26 are arranged in a corner portion of the mounting head 22, that is, on a corner side of an imaging range of the imaging unit 30. In the mounting head 22, the first fiducial marks 25 are arranged on a front side in the main movement direction (device rear side) of the mounting head 22 and the second fiducial marks 26 are arranged on a rear side in the main movement direction (device front side) of the mounting head 22. The first fiducial marks 25 and the second fiducial marks 26 are provided with a support column and a disc shape mark member that is arranged on the distal end of the support column. For example, the first fiducial marks 25 are arranged at predetermined distances L1 with a predetermined positional relationship with the second fiducial marks 26. In addition, the first fiducial mark 25a is arranged with a predetermined positional relationship with the first fiducial mark 25b (at predetermined distance L2). In the same manner, the second fiducial mark 26a is arranged with a predetermined positional relationship with the second fiducial mark 26b (at the predetermined distance L2). The suction nozzles 24a-24d have a predetermined positional relationship (distance or arrangement position) with the first fiducial marks 25 and the second fiducial marks 26, therefore it is possible to recognize respective positions if it is possible to recognize the positions of either the first fiducial marks 25 or the second fiducial marks 26.

The component supply unit 14 is provided with multiple reels and is attached to be attachable to and detachable from a front side of the mounting device 11. A tape is wound on each reel, and multiple components are held on a surface of the tape along a longitudinal direction of the tape. In a state in which the tape is unwound from the reel toward the rear, and the component are exposed, the tape is fed out by a feeder section to a collection position at which the components are sucked by the suction nozzles 24. The component supply unit 14 is provided with a tray unit that has a tray in which multiple components are arranged and mounted. The tray unit is provided with a moving mechanism that moves the tray to the predetermined collection position, and in the tray unit, the tray is fixed to a pallet and is pulled out from a magazine cassette which is not shown in the drawings. Multiple rectangular pockets are formed in the tray, and the components are accommodated in the pockets. The components that are accommodated in the tray have a large height or size in comparison to a component that is accommodated on the reel. The components 60 are stored in the tray of the tray unit.

The imaging unit 30 is a unit that images the first fiducial marks 25 and the second fiducial marks 26 that have the mounting head 22 and the components that are sucked by the mounting head 22. The imaging unit 30 is arranged between the component supply unit 14 and the board conveyance unit 12. The imaging range of the imaging unit 30 is above the imaging unit 30. The imaging unit 30 is provided with a lighting section 31, an illumination control section 32, an imaging device 33, and an image processing section 34. The lighting section 31 is configured to irradiate light upward and be able to irradiate light in multiple lighting states with respect to the components 60 that are held in the mounting head 22. The illumination control section 32 controls the lighting section 31 based on a predetermined lighting state so as to be in a lighting state according to the components that are sucked by the suction nozzles 24. The imaging device 33 is a device that outputs electric charge that is generated by receiving light. The imaging device 33 may be a CMOS image sensor that is able to carry out high-speed continuous acquisition processing by overlapping a transfer process of electric charge after exposure and an exposure process of a subsequent image. The image processing section 34 carries out a process in which image data is generated based on input electric charge. The imaging unit 30 images multiple images and outputs captured image data to the control device 40 after the suction nozzles 24 that suck the components 60 pass over the imaging unit 30.

As illustrated in FIG. 3, the control device 40 is configured as a microprocessor with a CPU 41 as the center, is provided with a ROM 42 which stores a processing program, an HDD 43 which stores various data, a RAM 44 which is used as a work region, and an input and output interface 45 for performing exchange of an external device and an electrical signal, and the like, and these components are connected via a bus 46. The control device 40 outputs a control signal to the board conveyance unit 12, the mounting unit 13, the component supply unit 14, and the imaging unit 30, and inputs a signal from the mounting unit 13, the component supply unit 14, and the imaging unit 30.

The management computer 50 is a computer that manages information on each device of the mounting system 10. The management computer 50 is provided with an input device 52 such as a keyboard and a mouse for inputting various instructions by an operator, and a display 54 that displays various information.

Figure 4:
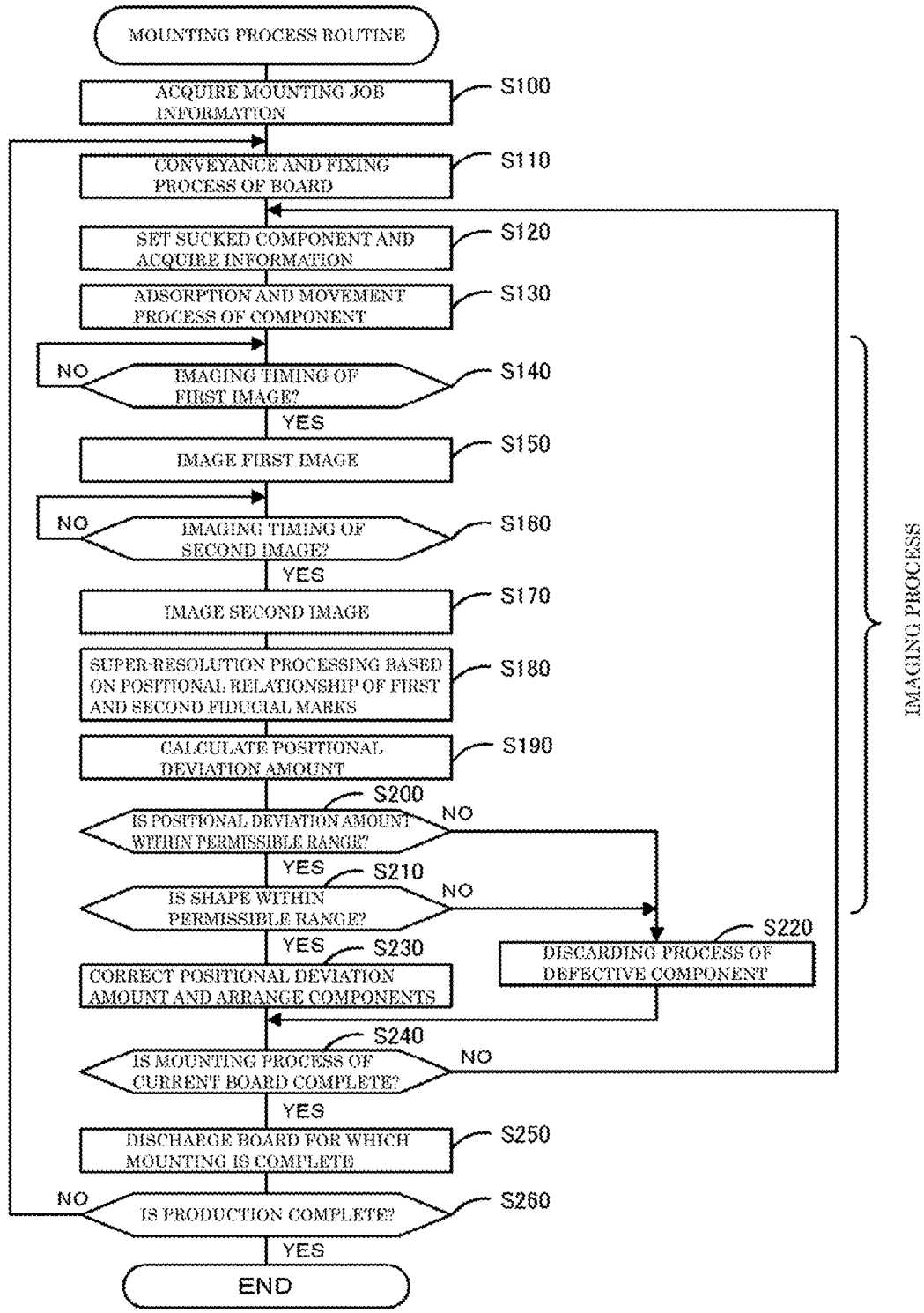
FIG. 4 is a flowchart illustrating an example of a mounting process routine.

Next, an operation of the mounting system 10 of the present embodiment that is configured in this manner, specifically, a mounting process of the mounting device 11 will be described. FIG. 4 is a flowchart illustrating an example of a mounting process routine which is performed by the CPU 41 of the control device 40. The routine is stored in the HDD 43 of the control device 40, and is performed according to a start instruction by the operator. In this arrangement, a case is mainly described in which the components 60 are mounted on the board S using the suction nozzles 24. When the routine starts, first, the CPU 41 of the control device 40 acquires mounting job information from the management computer 50 (step S100). Information on mounting order of the components, the type and feature of the mounted components, the suction nozzles that suck the components, and the like are included in the mounting job information. Information on the size of the components, a reference image that is an image of a normal shape component, and the like are included in the feature of the components.

Figure 5:
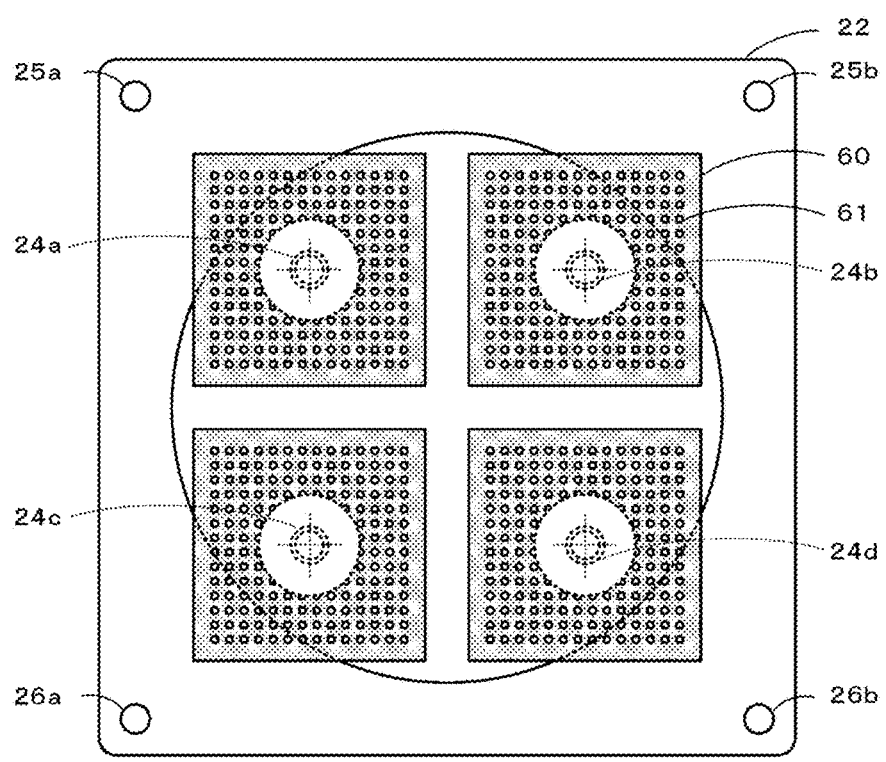
FIG. 5 is an explanatory diagram of the mounting head 22 that collects components 60.

Next, the CPU 41 carries out a conveyance and fixing process of the board S (step S110), and sets the sucked components and acquires the information on the components from the mounting job information (step S120). Next, the CPU 41 mounts the suction nozzles 24 on the mounting head 22 according to need, and carries out an adsorption and movement process of the set component (step S130). In the suction process, the CPU 41 performs a process of moving the mounting head 22 to the collection position of the component supply unit 14 in which an equivalent component is stored and lowering the suction nozzles 24 and sucking the components 60 to the suction nozzles 24. In the suction process, one or more components 60 may be sucked to the suction nozzles 24a-24d. In addition, in the movement process, the CPU 41 carries out a process in which the mounting head 22 to which the components 60 are sucked passes above the imaging unit 30, and moves to the mounting position of the board S. FIG. 5 is an explanatory diagram of the mounting head 22 that collects the components 60. As illustrated in FIG. 5, when relatively large components 60 are sucked and held, a large area is occupied in a region of the mounting head 22.

Figure 6:
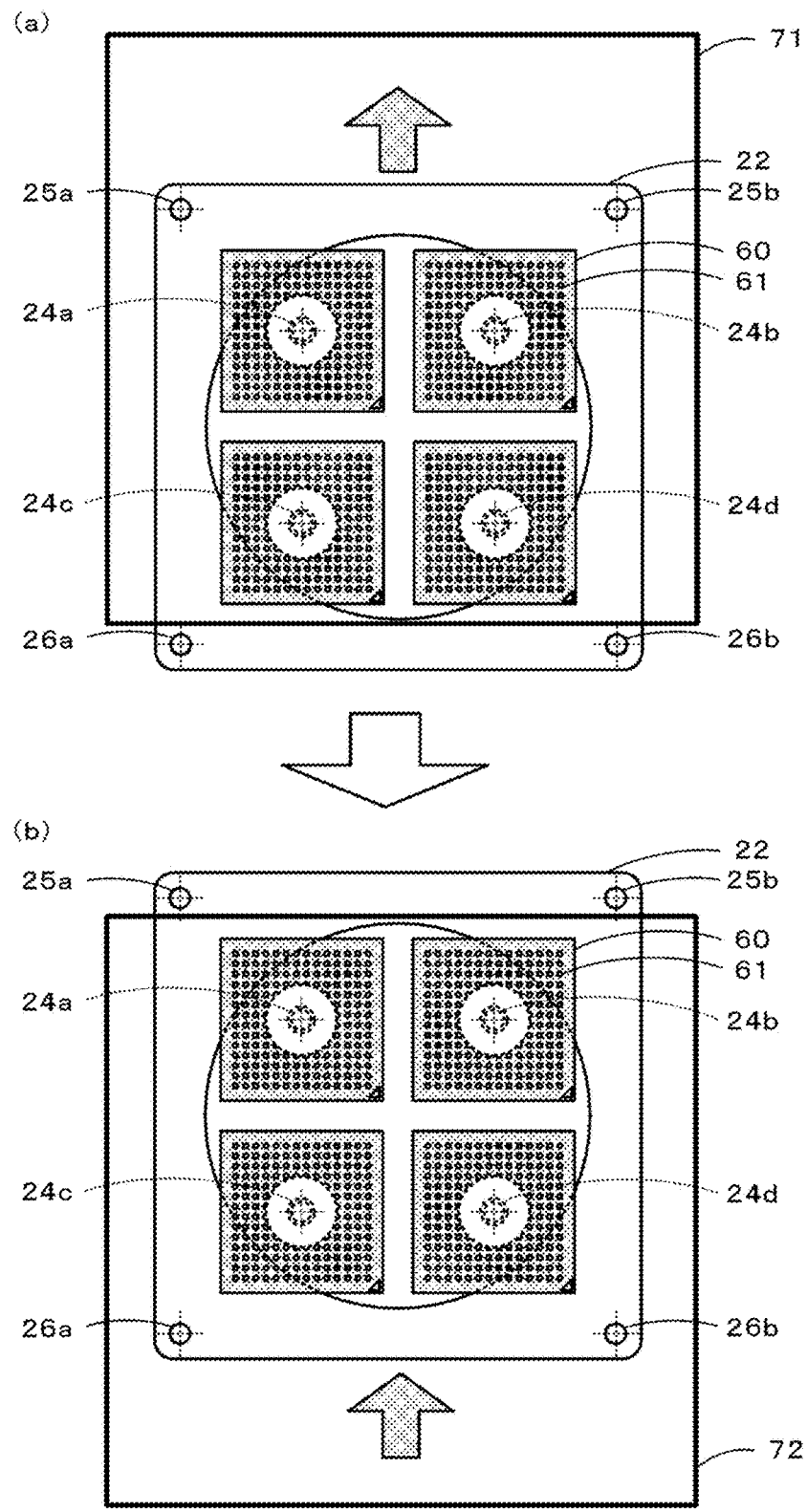
FIGS. 6(a) and 6(b) are explanatory diagrams of a first image 71 and a second image 72.

Next, the CPU 41 performs imaging processing in which the mounting head 22 during movement (components 60, and first fiducial marks 25 and second fiducial marks 26) is imaged multiple times (step S140-210). In the imaging processing, a process is carried out in which multiple images are imaged and an image is obtained of high image quality components 60 by performing super-resolution processing. In the imaging processing, first, the CPU 41 determines whether or not an imaging timing of the first image is reached (step S140), and the CPU 41 waits without change when the imaging timing of the first image is not reached and carries out imaging processing on the first image when the imaging timing of the first image is reached (step S150). For example, in the imaging timing of the first image, all components 60 that are collected in the suction nozzles 24a-24d may be in the same imaging range, and the imaging timing of the first image may be set to a timing at which at least the first fiducial marks 25 enter the imaging range of the imaging unit 30. For example, the CPU 41 may cause the imaging unit 30 to capture the first image 71 after the components 60 and the first fiducial marks 25 enter the same imaging range prior to the second fiducial marks 26 entering the imaging range. FIGS. 6(a) and 6(b) are explanatory diagrams of imaging processing for imaging multiple times, FIG. 6(a) is the first image 71 and FIG. 6(b) is the second image 72. When imaging at the imaging timing, during movement of the mounting head 22, it is possible to cause the imaging unit 30 to capture the first image 71 that includes the first fiducial marks 25 and the components 60 that are collected on the mounting head 22 (FIG. 6(a)).

Next, the CPU 41 determines whether or not an imaging timing of the second image is reached (step S160), and the CPU 41 waits without change when the imaging timing of the second image is not reached and carries out imaging processing on the second image when the imaging timing of the second image is reached (step S170). For example, the imaging timing of the second image may be set to be a timing deviated by a ½ pixel with respect to the first image such that it is possible to perform multi-frame super-resolution processing. In addition, in the imaging device 33, the imaging timing of the second image may be a timing after an exposure process on the first image and transfer of electric charge after exposure are carried out and exposure of the second image is complete. Alternatively, for example, in the imaging timing of the second image, all components 60 that are collected in the suction nozzles 24a-24d may be in the same imaging range, and the imaging timing of the second image may be set to a timing at which at least the second fiducial marks 26 enter the imaging range of the imaging unit 30. For example, the CPU 41 may cause the imaging unit 30 to capture the second image 72 after the first fiducial marks 25 come out from the imaging range and the collected components 60 and the second fiducial marks 26 enter the same imaging range. When imaging at the imaging timing, during movement of the mounting head 22, it is possible to cause the imaging unit 30 to capture the second image 72 that includes that components 60 that are collected on the mounting head 22 and the second fiducial marks 26 (FIG. 6(b)). Note that, each imaging timing does not exclude a case where the first fiducial marks 25 and the second fiducial marks 26 are included in the first image 71 and does not exclude a case where the first fiducial marks 25 and the second fiducial marks 26 are included in the second image 72.

Figure 7:
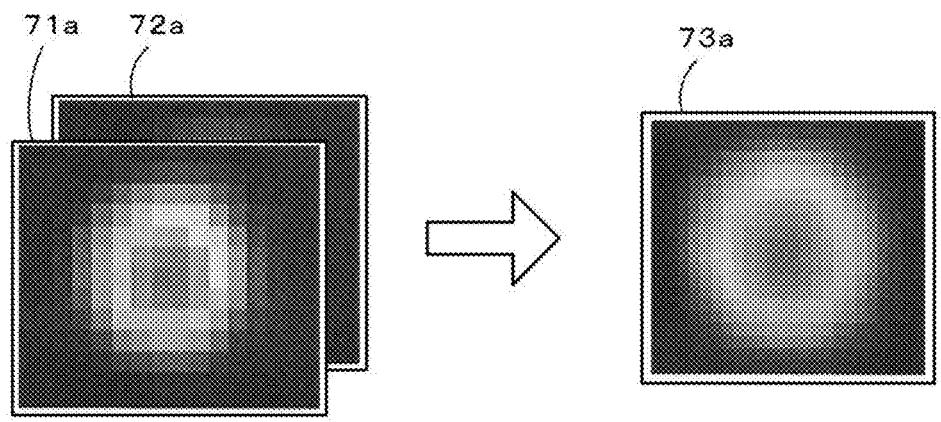
FIGS. 7(a) and 7(b) are explanatory diagrams in which super resolution images 73 are generated.
Figure 7:
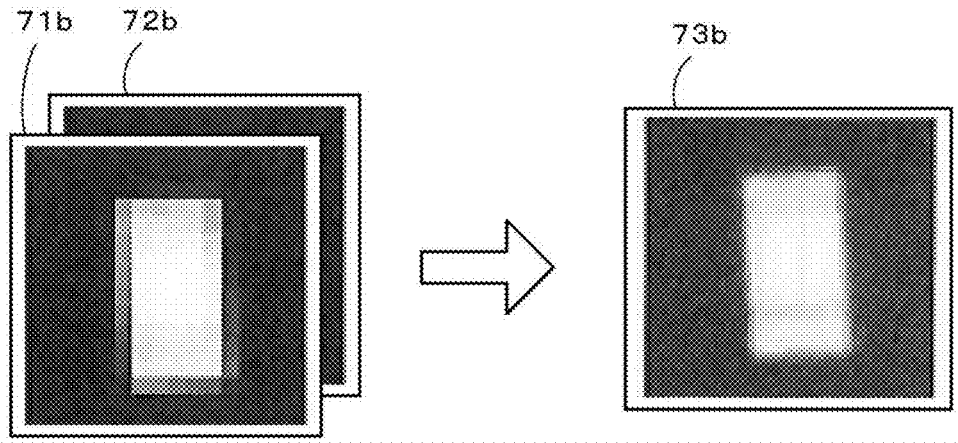

Next, the CPU 41 carries out super-resolution processing for producing an image of the components 60 that are collected on the mounting head 22 using the first image 71 and the second image 72 based on the positional relationship of the first fiducial marks 25 and the second fiducial marks 26 (step S180). For example, super-resolution processing determines the position of the imaging targets (components 60) that accurately overlap using multiple images, carries out a motion estimation process, a blur estimation process, and a reconstruction process, and produces a high resolution image in comparison to the imaged image. The super-resolution processing may be carried out by the image processing section 34. FIGS. 7(a) and 7(b) are explanatory diagrams in which super resolution images 73 are generated from the first image 71 and the second image 72, FIG. 7(a) is an image diagram of the bumps 61 and FIG. 7(b) is an image diagram of a chip component. As illustrated in FIGS. 7(a) and 7(b), in the mounting device 11, it is possible to produce the high resolution image using an image with a relatively low resolution. In the mounting device 11, it is required to image from the relatively small chip components up to a relatively large BGA components. Typically, the imaging unit 30 is not able to image a large component that has a narrow imaging range (visual field) when attempting to image a high resolution image, and the resolution is lowered when attempting to image a large-sized component. In the mounting device 11, it is possible to sufficiently secure image resolution when imaging a small-sized component or a small part by carrying out super-resolution processing while sufficiently securing the imaging range when imaging the large-sized component.

In this arrangement, an image processing of the components 60 will be described. In the mounting device 11, the mounting process may be carried out on the components 60 in which the external form is relatively large and a relatively small construction (bumps 61) is arranged on the components. In this case, absence, the external form, or the like of the bumps 61 may be detected since it is determined whether the components 60 are normal. It is possible to detect with high precision absence, the external form, or the like of the bumps 61 by, for example, producing a high quality image by carrying out composition processing on multiple images, and carrying out multi-frame super-resolution processing. When multi-frame super-resolution processing is carried out, preferably the fiducial marks are imaged along with the components 60, and images are superimposed by aligning the positions of the fiducial marks. In addition, in the mounting head 22, the fiducial marks tend not to be arranged on the center side of the mounting head 22 (refer to FIG. 5) when considering adsorption deviation, rotation, and the like in a case where multiple components with a relatively large external form such as the components 60 are sucked. For example, in a case where the fiducial marks are arranged on the outer peripheral side of the suction nozzles, the fiducial marks tend to come out from the imaging range when the components 60 that are collected on the mounting head 22 are included in the imaging range of the imaging unit 30 (refer to FIG. 6). In the mounting device 11, a problem is solved of using any fiducial marks (first fiducial marks 25 or second fiducial marks 26) with clearly different positional relationships using an imaging frame and the fiducial marks tending to be out of the imaging range. For example, it is possible to specify the positions of the components 60 in the first image 71 using the coordinates from the first fiducial marks 25 and further it is possible to specify the distances between the first fiducial marks 25 and the second fiducial marks 26 in the second image 72 using the coordinates from the second fiducial marks 26. Then, the CPU 41 produces high quality images by overlapping the images that are specified by the positions.

After step S180, the CPU 41 calculates suction positional deviation amounts of the components 60 that are collected on the mounting head 22 using the produced super resolution images (step S190). For example, it is possible to obtain the suction positional deviation amounts as a difference between coordinate values of the X-axis and the Y-axis of the center positions of the components 60 and the center positions of the suction nozzles 24 based on the positional relationship of the center coordinates of the first fiducial marks 25, the second fiducial marks 26, and the suction nozzles 24. Next, the CPU 41 determines whether or not the calculated suction positional deviation amounts are within the permissible range (step S200). For example, the permissible range is set in a range empirically determined to be a range of the positional deviation amounts at which it is possible to appropriately arrange the components 60 on the board S. When the suction positional deviation amounts are in the permissible range, the CPU 41 determines whether or not the shape of the component is within the permissible range (step S210). For example, in the determination, it is possible to carry out matching of a reference image and an image of the components 60 that are produced with super resolution images, and for example, carry out matching based on the matching degree based on the absence or the external form of the bumps 61.

The CPU 41 carries out a discarding process in which the components 60 are components in which a defect is generated when it is determined that a positional deviation amount or a shape difference is not within the permissible range in step S200 or step S210 (step S220). Meanwhile, when the shape of the component is within the permissible range in step S210, the CPU 41 performs a process in which the components P are mounted (arranged) at a position at which the calculated suction positional deviation amounts are corrected (step S230). Next, the CPU 41 determines whether or not the mounting process is completed by the mounting device 11 of the current board S (step S240), and the processes of step S120 and thereafter are performed when the mounting process of the current board S is not complete. That is, the CPU 41 sets the components 60 that are subsequently sucked, the first image and the second image are imaged by the imaging unit 30 out of the collected components 60, and the suction positional deviation amounts or shapes of the components 60 are determined by carrying out super-resolution processing. Meanwhile, when the mounting process of the current board S is completed in step S240, the CPU 41 discharges the board S on which mounting is completed (step S250), and determines whether or not production is completed (step S260). When the production is not completed, the CPU 41 performs the processes of step S110 and thereafter. That is, the CPU 41 conveys and fixes a new board S and performs the processes of step S120 and thereafter. Meanwhile, when production is completed in step S260, the CPU 41 ends the routine without any changes.

In this arrangement, the correspondence relationship between constituent elements of the present embodiment and constituent elements of the disclosure is clarified. The suction nozzles 24 of the present embodiment are equivalent to the collection member of the disclosure, the mounting head 22 is equivalent to the mounting head, the imaging unit 30 is equivalent to the imaging section, and the control device 40 is equivalent to the control section. In addition, the first fiducial marks 25, 25a, and 25b are equivalent to the first fiducial marks, and the second fiducial marks 26, 26a, and 26b are equivalent to the second fiducial marks. Note that, in the present embodiment, an example of an imaging processing method of the disclosure is clarified by describing the operation of the mounting device 11.

The mounting device 11 of the embodiment described above, during movement of a mounting head 22, images the first image 71 that includes the components 60 that are collected in the mounting head 22 and first fiducial marks 25, images the second image 72 that includes the components 60 that are collected in the mounting head 22 and second fiducial marks 26, and generates an image of the components 60 that are collected in the mounting head 22 using the first image 71 and the second image 72 based on the positional relationship of the first fiducial marks 25 and the second fiducial marks 26. The mounting device 11 is able to carry out positioning of the first image 71 and the second image 72 utilizing the positional relationship of the first fiducial marks 25 and the second fiducial marks 26, and obtain a high quality image that includes the components 60. In addition, in the mounting device 11, it is possible to further widen an imaging range up to a range that includes any fiducial mark and it is possible to suppress stopping of movement of the mounting head 22 while imaging the mounting head 22. Accordingly, the mounting device 11 is able to obtain a higher quality image while further suppressing lowering of productivity.

In addition, in the mounting head 22, it is possible to set the position of the first fiducial marks 25 and the second fiducial marks 26 further separated from each other and it is possible to further widen the imaging range since the first fiducial marks 25 and the second fiducial marks 26 are arranged on the outer peripheral side of the suction nozzles 24. Furthermore, in this mounting device 11, the mounting head 22 tends to obtain a higher quality image while further suppressing lowering of productivity since either of the first fiducial marks 25 and the second fiducial marks 26 tend to enter the imaging range even if the mounting head 22 moves since the first fiducial marks 25 and the second fiducial marks 26 are arranged on the front side and the rear side in the movement direction of the mounting head 22. Still further, in the mounting device 11, is obtained to use a higher quality image to carry out determination of whether the shapes and positions of the components 60 are appropriate since the control device 40 determines the shapes of the components 60 and the suction positions of the components 60 based on the image of the produced components 60. Then, in the mounting device 11, imaging efficiency is good since multiple components are imaged in the same image.

Note that, needless to say, the disclosure is not limited to the embodiments described above, and it is possible to execute various forms within the technical scope of the disclosure.

Figure 8:
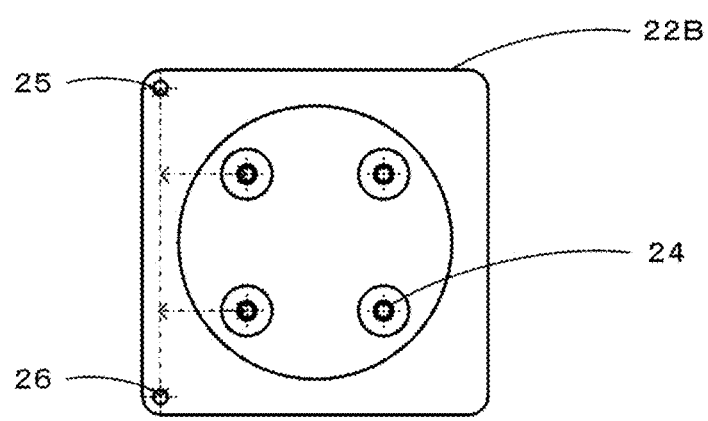
FIG. 8 is an explanatory diagram of a mounting head 22B.

For example, in the embodiments described above, the mounting head 22 has four fiducial marks of the first fiducial marks 25a and 25b and the second fiducial marks 26a and 26b, but is not particularly limited thereto. FIG. 8 is an explanatory diagram of a mounting head 22B that is provided with one of the first fiducial marks 25 and the second fiducial marks 26. As illustrated in FIG. 8, for example, the mounting head 22 is able to set the first fiducial marks 25 and the second fiducial marks 26 respectively one at a time if the parallel manner of the mounting head 22 with respect to the front-rear direction of the device is secured. Alternatively, for example, there may be three fiducial marks that are arranged in an L shape such as the first fiducial marks 25a and 25b and the second fiducial mark 26a.

In the embodiments described above, the components 60 (BGA components) in which the imaging targets of the imaging unit 30 carry out arrangement of the bumps 61 are described, but are not particularly limited thereto. For example, the components that are imaged by the imaging unit 30 are relatively large components and are able to set small parts that it is necessary to recognize. Such components are effectively applied in the disclosure.

In the embodiments described above, a case where the first image 71 and the second image 72 are imaged while moving the mounting head 22 in the front-rear direction of the device is mainly described, but the first image 71 and the second image 72 may be imaged when moving in the front-back direction and the left-right direction, that is, diagonally above the imaging unit 30.

In the embodiments described above, two images are imaged and super-resolution processing is carried out, but it is not particularly limited thereto if multiple images are used, and three or more images may be imaged and super-resolution processing may be carried out.

In the embodiments described above, the collection member is described as the suction nozzles 24, but is not particularly limited thereto if the components are collected, and for example, the components may be mechanically interposed and set as the collected mechanical chuck.

In the embodiments described above, the disclosure is described as the mounting device 11, but for example, may be the imaging unit 30, the imaging processing method or a control method of the imaging unit 30 may, and a program that performs the processes described above using a computer.

INDUSTRIAL APPLICABILITY

The disclosure is usable in a device that carries out the mounting process in which the component is mounted on the board.

REFERENCE SIGNS LIST

10: MOUNTING SYSTEM, 11: MOUNTING DEVICE, 12: BOARD CONVEYANCE UNIT, 13: MOUNTING UNIT, 14: COMPONENT SUPPLY UNIT, 20: HEAD MOVING SECTION, 22, 22B: MOUNTING HEAD, 23: Z-AXIS MOTOR, 24, 24a-24d: SUCTION NOZZLE, 25, 25a, 25b: FIRST FIDUCIAL MARK, 26, 26a, 26b: SECOND FIDUCIAL MARK, 30: IMAGING UNIT, 31: LIGHTING SECTION, 32: ILLUMINATION CONTROL SECTION, 33: IMAGING DEVICE, 34: IMAGE PROCESSING SECTION, 40: CONTROL DEVICE, 41: CPU, 42: ROM, 43: HDD, 44: RAM, 45: INPUT AND OUTPUT INTERFACE, 46: BUS, 50: MANAGEMENT COMPUTER, 52: INPUT DEVICE, 54: DISPLAY, 60: COMPONENT, 61: BUMP, 71a, 71b: FIRST IMAGE, 72a, 72b: SECOND IMAGE, 73a, 73b: SUPER RESOLUTION IMAGE, S: BOARD

The invention claimed is:

1. A mounting device comprising:
a mounting head that has first fiducial marks, second fiducial marks that have a predetermined positional relationship with the first fiducial marks, and a collection member that collects components, and moves the collected components on a board;
an imaging section that captures an image; and
a control section that, during movement of the mounting head, causes the imaging section to capture a first image that includes the components that are collected in the mounting head and the first fiducial marks, causes the imaging section to capture a second image that includes the components that are collected in the mounting head and the second fiducial marks, and generates an image of the components that are collected in the mounting head using the first image and the second image based on the positional relationship of the first fiducial marks and the second fiducial marks.

2. The mounting device according to claim 1,
wherein in the mounting head, the first fiducial marks and the second fiducial marks are arranged on the outer peripheral side of the collection member.

3. The mounting device according to claim 1,
wherein in the mounting head, the first fiducial marks and the second fiducial marks are arranged on the front side and the rear side in the movement direction of the mounting head.

4. The mounting device according to claim 1,
wherein the control section determines one or more out of the shapes of the components and the positions of the components based on the generated image of the components.

5. The mounting device according to claim 1,
wherein the mounting head has two or more collection members, and
the control section causes the imaging section to capture the first image and the second image at a timing at which the components that are collected in the two or more collection members are in the same imaging range.

6. The mounting device according to claim 1,
wherein the control section causes the imaging section to capture the first image after the components and the first fiducial marks enter the same imaging range prior to the second fiducial marks entering the imaging range, and after that, causes the imaging section to capture the second image after the first fiducial marks come out from the imaging range and the collected components and the second fiducial marks enter the same imaging range.

7. An imaging processing method in a mounting device that includes a mounting head that has first fiducial marks, second fiducial marks that have a predetermined positional relationship with the first fiducial marks, and a collection member that collects components, and moves the collected components on the board, and an imaging section that captures an image, the method comprising:
(a) a step of, during movement of the mounting head, causing the imaging section to capture a first image that includes the components that are collected in the mounting head and the first fiducial marks, and causing the imaging section to capture a second image that includes the components that are collected in the mounting head and the second fiducial marks; and (b) a step of generating an image of the components that are collected in the mounting head using the first image and the second image based on the positional relationship of the first fiducial marks and the second fiducial marks.

8. An imaging unit which is used in a mounting device that includes a mounting head that has first fiducial marks, second fiducial marks that have a predetermined positional relationship with the first fiducial marks, and a collection member that collects components, and moves the collected components on a board, the unit comprising:

an imaging section that captures an image; and a control section that, during movement of the mounting head, causes the imaging section to capture a first image that includes the components that are collected in the mounting head and the first fiducial marks, causes the imaging section to capture a second image that includes the components that are collected in the mounting head and the second fiducial marks, and generates an image of the components that are collected in the mounting head using the first image and the second image based on the positional relationship of the first fiducial marks and the second fiducial marks.

* * * * *